(12) United States Patent
Louwagie et al.

(10) Patent No.: US 11,181,403 B2
(45) Date of Patent: Nov. 23, 2021

(54) PROCESS VARIABLE SENSOR TESTING

(71) Applicant: Rosemount Inc., Shakopee, MN (US)

(72) Inventors: Bennett Leon Louwagie, Plymouth, MN (US); Nicholas Aaron Wienhold, Waconia, MN (US)

(73) Assignee: ROSEMOUNT INC., Shakopee, MN (US)

( * ) Notice: Subject to any disclaimer, the term of this patent is extended or adjusted under 35 U.S.C. 154(b) by 150 days.

(21) Appl. No.: 16/580,266

(22) Filed: Sep. 24, 2019

(65) Prior Publication Data

US 2021/0088365 A1    Mar. 25, 2021

(51) Int. Cl.
| | | |
|---|---|---|
| *G01D 21/02* | (2006.01) | |
| *G01K 3/00* | (2006.01) | |
| *G08C 19/02* | (2006.01) | |
| *G01K 7/16* | (2006.01) | |
| *G01L 7/08* | (2006.01) | |

(52) U.S. Cl.
CPC ............. *G01D 21/02* (2013.01); *G01K 3/005* (2013.01); *G08C 19/02* (2013.01); *G01K 7/16* (2013.01); *G01L 7/082* (2013.01)

(58) Field of Classification Search
None
See application file for complete search history.

(56) References Cited

U.S. PATENT DOCUMENTS

| | | | |
|---|---|---|---|
| 3,665,756 A | 5/1972 | Russell | |
| 5,631,602 A | 5/1997 | Kearney et al. | |
| 6,295,875 B1 | 10/2001 | Frick et al. | |
| 7,308,830 B2 | 12/2007 | Harasyn et al. | |
| 7,464,721 B2 | 12/2008 | Perry et al. | |
| 2017/0343594 A1 | 11/2017 | Raman et al. | |

OTHER PUBLICATIONS

Office Action from Chinese Patent Application No. 202020152542.1, dated Jul. 1, 2020.
Notification of Transmittal of International Search Report and the Written Opinion of the International Searching Authority from International Application No. PCT/US2020/031008, dated Jul. 21, 2020.

*Primary Examiner* — Lisa M Caputo
*Assistant Examiner* — Nigel H Plumb
(74) *Attorney, Agent, or Firm* — Westman, Champlin & Koehler, P.A.

(57) ABSTRACT

A process transmitter includes a process variable sensor, a test circuit, a switch and a controller. The process variable sensor includes a sensor output that is indicative of a sensed process variable. The test circuit is configured to detect a condition of the process variable sensor. The switch is configured to selectively connect the test circuit to the process variable sensor and disconnect the test circuit from the process variable sensor. The controller is configured to obtain a measurement of the process variable, control the switch, detect a condition of the process variable sensor by comparing the sensor output when the test circuit is connected to the process variable sensor to the sensor output when the test circuit is disconnected from the process variable sensor, and communicate the condition in the measurement to an external control unit.

24 Claims, 6 Drawing Sheets

PROCESS VARIABLE SENSOR TESTING

FIELD

Embodiments of the present disclosure relate to industrial process transmitters and, more specifically, to monitoring of process variable sensors of industrial process transmitters.

BACKGROUND

Industrial process field devices, such as process transmitters, are used in industrial process control and monitoring systems to monitor industrial process variables and communicate measured values of the process variable back to a control room in a chemical, petroleum, gas, pharmaceutical, or other fluid processing plant, for example. The term "process variable" refers to a physical or chemical state of matter or conversion of energy. Examples of process variables include pressure, temperature, flow, conductivity, pH, and other properties.

Process transmitters use process variable sensors to detect or measure process variables. Such sensors have the potential to malfunction or fail, which could result in faulty process variable measurements. Testing of process transmitters by a skilled technician may be periodically required to detect failing or degrading process variable sensors, but such testing may require the process transmitter to be taken offline for an extended period of time, removed from service and/or transported to a testing facility.

SUMMARY

Embodiments of the present disclosure generally relate to a process transmitter having the ability to self-test a process variable sensor of the transmitter, and a method of testing a process variable sensor of a process transmitter. One embodiment of the process transmitter includes a process variable sensor, a test circuit, a switch and a controller. The process variable sensor includes a sensor output that is indicative of a sensed process variable. The test circuit is configured to detect a condition of the process variable sensor. The switch is configured to selectively connect the test circuit to the process variable sensor and disconnect the test circuit from the process variable sensor. The controller is configured to obtain a measurement of the process variable, control the switch, detect a condition of the process variable sensor by comparing the sensor output when the test circuit is connected to the process variable sensor to the sensor output when the test circuit is disconnected from the process variable sensor, and communicate the condition in the measurement to an external control unit.

In one embodiment of the method of testing a process variable sensor of a process transmitter, a switch is set to disconnect a test circuit from the process variable sensor. A first sensor output is obtained from the process variable sensor that is indicative of a sensed process variable. The switch is set to connect the test circuit to the process variable sensor, and a second sensor output is obtained from the process variable sensor. A condition of the process variable sensor is detected based on a comparison of the first and second sensor outputs. Finally, the condition is communicated to an external control unit.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Embodiments of the present disclosure are described more fully hereinafter with reference to the accompanying drawings. Elements that are identified using the same or similar reference characters refer to the same or similar elements. The various embodiments of the present disclosure may be embodied in many different forms and should not be construed as limited to the specific embodiments set forth herein. Rather, these embodiments are provided so that this disclosure will be thorough and complete, and will fully convey the scope of the present disclosure to those skilled in the art.

Figure 1:
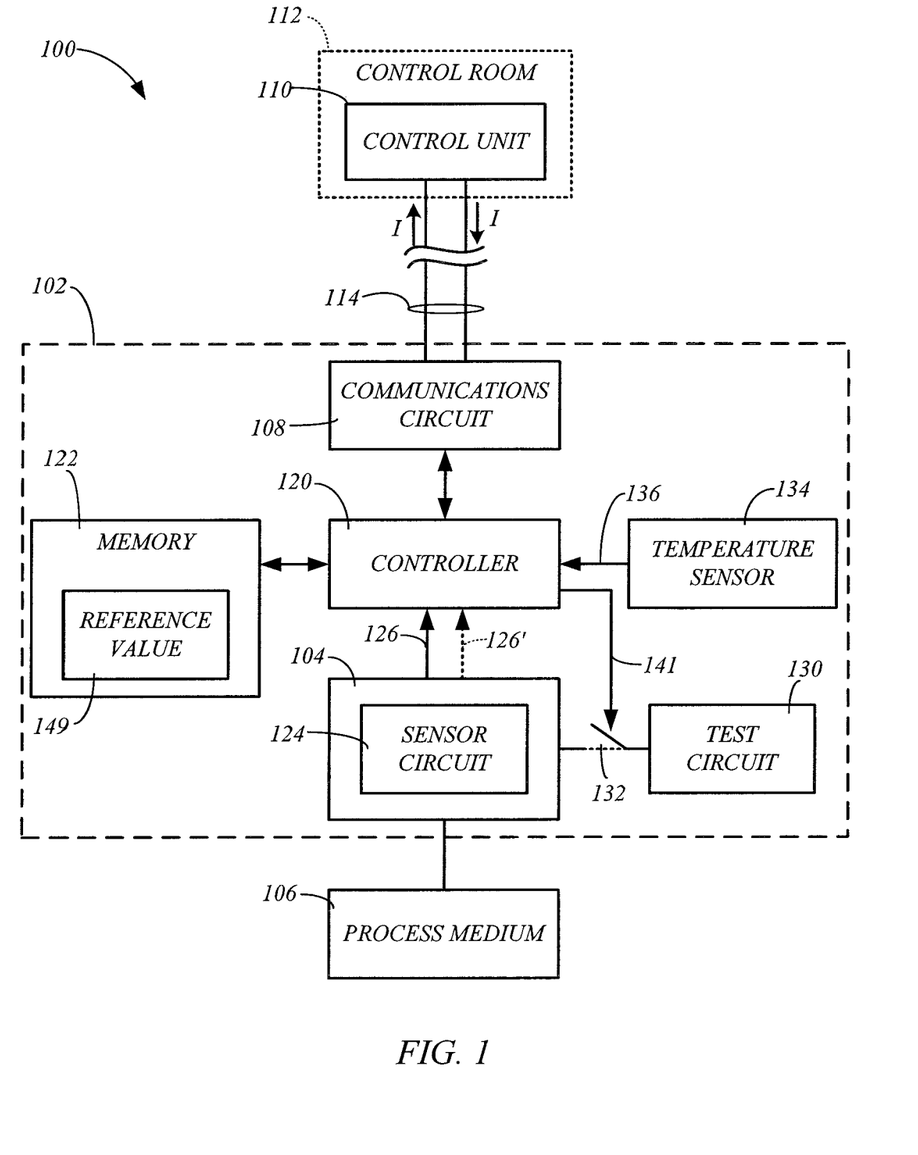
FIG. 1 is a simplified diagram of an exemplary industrial process measurement system, in accordance with embodiments of the present disclosure.

FIG. 1 is a simplified diagram of an exemplary industrial process measurement system 100, in accordance with embodiments of the present disclosure. The system 100 may be used in the processing of a material (e.g., process medium) to transform the material from a less valuable state into more valuable and useful products, such as petroleum, chemicals, paper, food, etc. For example, the system 100 may be used in an oil refinery that performs industrial processes that can process crude oil into gasoline, fuel oil, and other petrochemicals.

The system 100 includes a process transmitter 102 or other field device that utilizes a process variable sensor 104 to sense a process variable, such as a variable relating to a process medium 106, which may be contained in a process vessel, such as a tank or a pipe, for example. The process transmitter 102 includes communications circuit 108 for communicating with an external computerized control unit 110 over a suitable process control loop. The control unit 110 may be remotely located from the transmitter 102, such as in a control room 112 for the system 100, as shown in FIG. 1.

In some embodiments, the process control loop includes a physical communication link, such as a two-wire control loop 114, or a wireless communication link. Communications between the control unit 110, or another external computing device, and the process transmitter 102 may be performed over the control loop 114 in accordance with conventional analog and/or digital communication protocols. In some embodiments, the two-wire control loop 114 includes a 4-20 milliamp control loop, in which a process variable may be represented by a level of a loop current I flowing through the two-wire control loop 114. Exemplary digital communication protocols include the modulation of digital signals onto the analog current level of the two-wire control loop 114, such as in accordance with the HART® communication standard. Other purely digital techniques may also be employed including FieldBus and Profibus communication protocols.

Exemplary wireless versions of the process control loop include, for example, a wireless mesh network protocol, such as WirelessHART® (IEC 62591) or ISA 100.11a (IEC 62734), or another wireless communication protocol, such as WiFi, LoRa, Sigfox, BLE, or any other suitable protocol.

Power may be supplied to the process transmitter 102 from any suitable power source. For example, the process transmitter 102 may be wholly powered by the current I flowing through the control loop 114. One or more power supplies may also be utilized to power the process transmitter 102, such as an internal or an external battery. An electrical power generator (e.g., solar panel, a wind power generator, etc.) may also be used to power the process transmitter 102, or charge a power supply used by the process transmitter 102.

In some embodiments, the transmitter 102 includes a controller 120, which may represent one or more processors (i.e., microprocessor, microcontroller, central processing unit, etc.) that control components of the transmitter 102 to perform one or more functions described herein in response to the execution of instructions, which may be stored locally in any suitable patent subject matter eligible computer readable media or memory 122 that does not include transitory waves or signals, such as, for example, hard disks, CD-ROMs, optical storage devices, or magnetic storage devices. The processors of the controller 120 may be components of one or more computer-based systems. In some embodiments, the controller 120 includes one or more control circuits, microprocessor-based engine control systems, one or more programmable hardware components, such as a field programmable gate array (FPGA), that are used to control components of the transmitter 102 to perform one or more functions described herein.

As mentioned above, the sensor 104 may be used to sense a process variable relating to an industrial process, such as a process variable associated with the process medium 106. This sensing function may be facilitated using a sensor circuit 124 that generates a sensor output 126 indicating the process variable when operating in a sensing mode. The sensor output 126 may be processed by the controller 120 and communicated to the control unit 110 or another external computing device using the communications circuit 108.

As discussed above, process variable sensors may degrade and fail, which can result in faulty process variable measurements. In order to detect a degrading or failing process variable sensor, conventional process transmitters are taken offline for testing and possibly transported to a testing facility. As a result, such periodic testing of the field devices can be costly and lead to significant downtime.

Embodiments of the present disclosure include a test circuit 130 that is used to operate the process variable sensor 104 in a testing mode, in which one or more diagnostic tests may be performed on the sensor 104 to determine whether it is operating properly. In some embodiments, the test circuit 130 alters the sensor circuit 124 to generate a testing mode sensor output 126' that is indicative of a condition of the process variable sensor 104.

The controller 120 activates the testing mode by controlling a switch 132 to connect the test circuit 130 to the sensor circuit 124. The controller uses the testing mode sensor output 126' to determine a current condition of the sensor 104. The current condition may indicate whether the sensor 104 is operating properly (e.g., within a normal operating range) or abnormally. The controller 120 may also communicate the current condition to the control unit 110 or another external computing device using the communications circuit 108 over the process control loop (e.g., physical or wireless communication link). The controller 120 may return the sensor 104 to the sensing mode by disconnecting the test circuit 130 from the sensor circuit 104 using the switch 132.

In some embodiments, the transmitter 102 includes a temperature sensor 134 having a temperature output 136 that may indicate a temperature relating to the process transmitter 102, such as a temperature of the process variable sensor 104. The controller 120 may use the temperature output to compensate the sensor output 126 indicating the sensed process variable when the sensor 104 is operated in the sensing mode, and/or the testing mode sensor output 126' when the sensor 104 is operated in the testing mode, for example.

Figure 2:
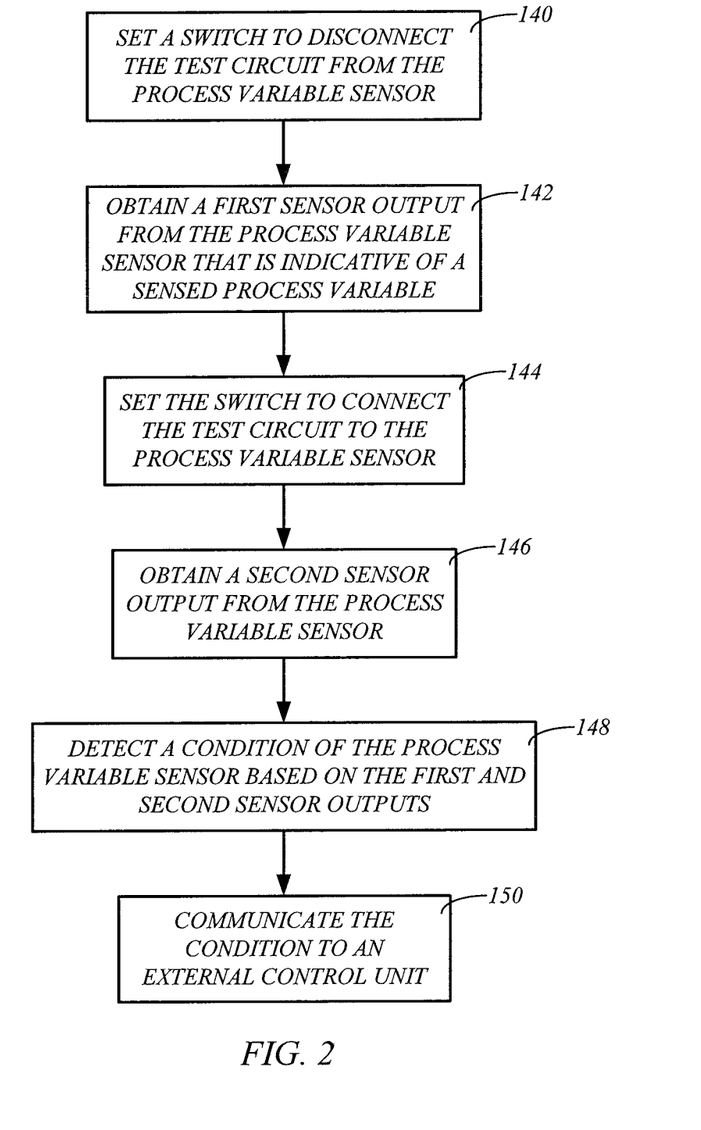
FIG. 2 is a flowchart illustrating an exemplary method for testing a condition of a process variable sensor of an industrial process transmitter, in accordance with embodiments of the present disclosure.

FIG. 2 is a flowchart illustrating an exemplary method for testing a condition of a process variable sensor 104 of an industrial process transmitter 102, in accordance with embodiments of the present disclosure. The method steps may be performed using the controller 120, such as in response to the execution of program instructions stored in the memory 122 (FIG. 1) by a processor of the controller 120, for example.

At 140 of the method, the switch 132 is set to disconnect the test circuit 130 from the sensor 104, such as from the sensor circuit 124, to operate the sensor 104 in the sensing mode. This may involve opening or closing the switch 132 using a switch signal 141 from the controller 120, for example, as indicated in FIG. 1.

At 142 of the method, a first sensor output 126 (sensing mode sensor output) is obtained from the process variable sensor 104 that is indicative of a sensed process variable. As discussed above, the sensed process variable may relate to a process medium 106, for example.

The switch 132 is set to connect the test circuit 130 to the process variable sensor 104 or the sensor circuit 124, at step 144 of the method. This setting of the test circuit 130 may be performed using a switch signal 141 from the controller 120, as indicated in FIG. 1. As a result, the transmitter 102 is placed in the testing mode.

At 146 of the method, a second sensor output 126' (testing mode sensor output) is obtained from the process variable sensor 104. The second sensor output 126' indicates a value that is offset from the value indicated by the first sensor output 126 due to the test circuit 130.

At 148 of the method, a condition of the process variable sensor 104 is detected based on the first sensor output 126 and the second sensor output 126'. In some embodiments, the condition of the process variable sensor 104 is indicated by the offset between the first sensor output 126 and the second sensor output 126'. Thus, embodiments of the method step 148 include detecting the condition of the process variable sensor 104 by comparing the first sensor output 126 to the second sensor output 126', such as by calculating a difference between the first sensor output 126 and the second sensor output 126'. The offset between the sensor outputs 126 and 126' may then be compared to a reference value 149, which may be stored in the memory 122, to determine the condition of the process variable sensor 104. For example, the process variable sensor 104 may be determined to have a normal operating condition when the difference between the sensor outputs 126 and 126' is less than the reference value 149, and the condition of the process variable sensor 104 may be determined to be abnormal (e.g., degrading, malfunctioning, etc.) when the difference between the sensor outputs 126 and 126' meets or exceeds the reference value 149. For example, the abnormal condition may indicate a change in sensor resistance, undesirable leakage current, change in power supply, in the case of capacitive sensor, a change in sensor capacitor dielectric or an error with sensor circuit 124.

In some embodiments of step 148, the condition of the process variable sensor 104 is further based on the temperature indicated by the temperature signal output by the temperature sensor 134. For example, the temperature indicated by the temperature sensor 134 may be used to adjust the values indicated by the sensor output 126 and/or the sensor output 126'. Additionally, the temperature indicated by the temperature sensor 134 may be used to adjust the reference value 149.

In some embodiments, the testing circuit is configured to produce a sensor output 126' that is less than a safety deviation, such as one-half of the safety deviation, from the sensing mode sensor output 126. For example, the testing circuit may be configured to produce a sensor output 126' that is less than 1% of the sensing mode sensor output 126 when the safety deviation for the transmitter 102 is about 2%.

For some applications, due to the variation between the testing mode sensor output 126' and the sensor output 126 being within the safety deviation for the transmitter 102, the testing mode sensor output 126' may be used during normal operation of the transmitter 102, thereby allowing the transmitter 102 to remain online during the testing of the process variable sensor 104. Thus, the testing of the process variable sensor 104 may be carried out without having to take the transmitter 102 offline Additionally, even when it is necessary to take the transmitter 102 offline, the testing of the process variable sensor 104 may be completed in a short period of time (e.g., less than 10 seconds), resulting in minimal interruption to the operation of the transmitter 102.

In one embodiment, the sensor output 126' from the sensor 104 or the sensor output transmitted by the transmitter 102 may be compensated to account for the change due to the connection of the test circuit 130 by the switch 132. Alternatively, during the testing of the sensor 104, the transmitter 102 may be configured to transmit the value associated with the last sensor output 126 until the testing of the sensor 104 is complete. Either approach minimizes the effect of performing the sensor test on the operation of the transmitter 102.

At 150 of the method, the condition of the process variable sensor 104 may be communicated to an external control unit, such as the control unit 110 (FIG. 1) or another computing device using the communication circuit 108.

After step 148 and prior to step 150, additional method steps may be performed. For example, the switch 132 may be returned to its original state to allow operation of the sensor 104 in the sensing mode. Additionally, a third sensor output 126 may then be detected and used in the detection of the condition of the sensor 104.

Figure 3:
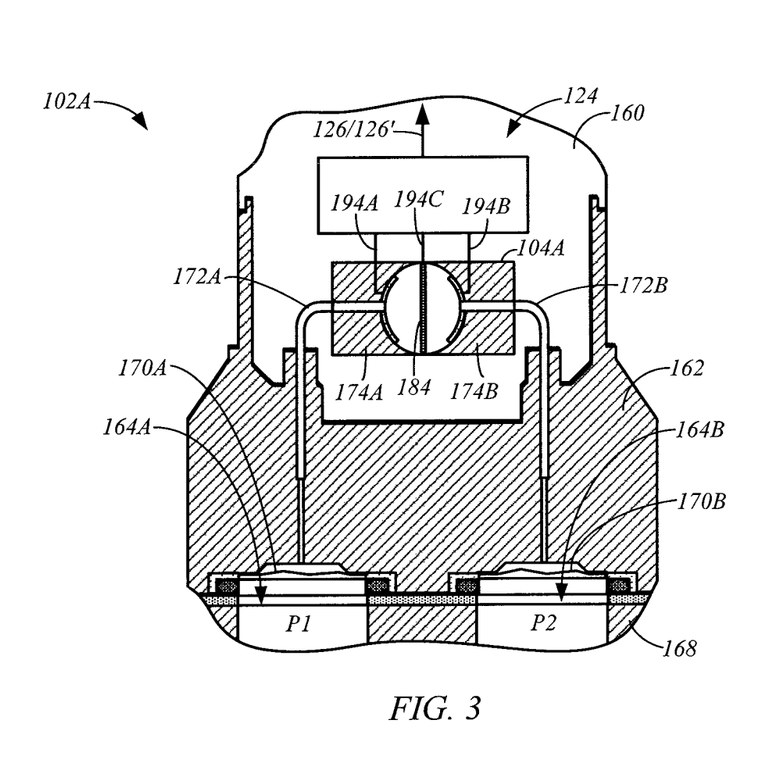
FIG. 3 is a simplified side cross-sectional view of a differential pressure sensor, in accordance with embodiments of the present disclosure.

The test circuit 130 may take on different forms depending upon the type of process variable sensor 104 and the configuration of the sensor circuit 124. Process variable sensors may include strain gauges or capacitance sensors to detect a process variable, such as a pressure of the process medium 106, for example. FIG. 3 is a simplified side cross-sectional view of a pressure transmitter 102A that includes an exemplary differential pressure sensor 104A having capacitance sensors, in accordance with embodiments of the present disclosure.

The transmitter 102A may include a housing 160 that encloses and protects electronics of the transmitter 102A from environmental conditions including the differential pressure sensor 104A. The housing 160 includes a base 162 that may include one or more process openings 164, such as process openings 164A and 164B. The process openings 164 may be coupled to the process medium 106 through suitable connections, such as through a process interface 168.

The exemplary transmitter 102A may include diaphragms 170A and 170B that are respectively exposed to pressures P1 and P2 of the process medium 106 that are respectively presented to the process openings 164A and 164B, as shown in FIG. 3. The diaphragms 170A and 170B flex in response to the pressures P1 and P2. The flexing diaphragms 170A and 170B communicate the sensed pressure to the pressure sensor 104A through lines 172A and 172B, which may be filled with an incompressible fluid (e.g., hydraulic fluid).

Figure 4:
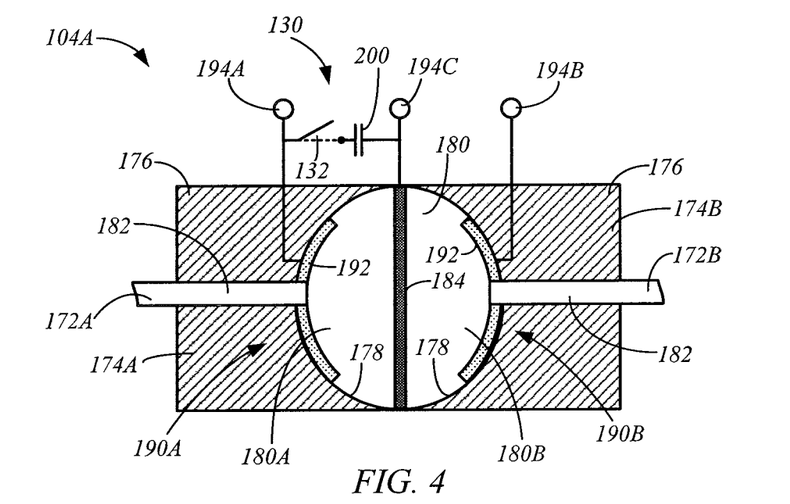
FIGS. 4 and 5 are side cross-sectional views of the exemplary differential pressure sensor shown in FIG. 3 in combination with exemplary test circuits, in accordance with embodiments of the present disclosure.
Figure 5:
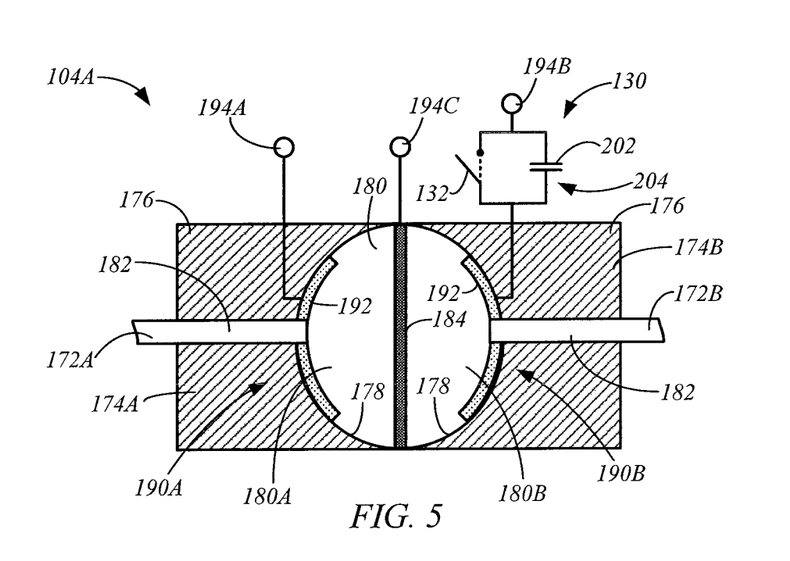

FIGS. 4 and 5 are side cross-sectional views of the exemplary differential pressure sensor 104A shown in FIG. 3 in combination with exemplary test circuits 130, in accordance with embodiments of the present disclosure. The differential pressure sensor 104A includes a pair of sensor body cells 174A and 174B, which may be generally referred to as cells 174. Each of the cells 174 includes a cup-like metal housing 176 having concave walls 178 that define an interior cavity 180. Fluid pathways 182 of each sensor body cell 174 extend through the cells 174, and couple the lines 172 to the interior cavity 180, which is also filled with the incompressible fluid. A sensing diaphragm 184 is supported between the cells 174 and divides the cavity 180 into two generally equal and opposite cavity halves 180A and 180B. The diaphragm 184 deflects in response to the process pressures P1 and P2 that are respectively transferred to the interior cavity halves 180A and 180B through the lines 172A and 172B and the fluid pathways 182. The displacement of the deflected diaphragm 184 is proportional to the difference in the pressures P1 and P2.

The position of the diaphragm 184 with respect to the walls 178 is detected using one or more capacitance sensors 190, such as capacitance sensors 190A and 190B. The capacitance sensors 190 each include a capacitor electrode 192 that is attached to the wall 178 and the conductive diaphragm 184. The sensor circuit 124 includes lead wires 194A, 194B and 194C that are respectively coupled to each of the capacitor electrodes 192 and the diaphragm 184 for receiving the capacitance of each of the capacitance sensors 190. Thus, the capacitance of the capacitance sensor 190A is obtained using the lead wires 194A and 194C, and the capacitance of the capacitance sensor 190B is obtained through the lead wires 194B and 194C. The sensor output 126 may include the capacitance from one or both of the sensors 190, or the difference between the capacitances (sensor outputs 126) of the sensors 190A and 190B. Thus, the sensor output 126 may be indicative of the position of the diaphragm 184 and the differential pressure (P1-P2) across the diaphragm 184.

As shown in FIG. 4, one embodiment of the test circuit 130 includes a capacitor 200 that is connected in series with the switch 132 between one of the lead wires 194 that is connected to a capacitor electrode 192, such as the lead wire 194A, and the lead wire 194C that is connected to the diaphragm 184. Any suitable capacitor 200 may be used in the test circuit 130. For example, when the sensor 104A has a 30 pico-farad active capacitance at zero differential pressure, the capacitor 200 may be a 0.2-0.4 pico-farad capacitor, such as a 0.3 pico-farad capacitor, to provide a testing mode output 126' that is about a 1% shift from the sensing mode sensor output 126.

The controller 120 closes the switch 132 to connect the test circuit 130 to the sensor 104A or its sensor circuit and place the sensor 104A in the testing mode, and opens the switch 132 to disconnect the test circuit 130 from the sensor 104A or its sensor circuit and place the sensor 104A in the sensing mode. When in the testing mode (switch 132 closed), the capacitance output from the capacitance sensor 190A is shifted or offset from its value when the sensor 104A is operated in the sensing mode (switch 132 opened). As discussed above, the offset between these two values may be compared to the reference value 149 (FIG. 1) by the controller 120 to determine whether the sensor 104A is operating normally or abnormally.

The embodiment of the testing circuit 130 shown in FIG. 5 includes a capacitor 202 that is connected in parallel with the switch 132 to form a parallel circuit 204. The parallel circuit 204 is connected in series with one of the lead wires 190 that is connected to a capacitor electrode 192, such as the lead wire 190B, as shown in FIG. 5. Any suitable capacitor 202 may be used in the test circuit 130. For example, when the sensor 104A has a 30 pico-farad active capacitance at zero differential pressure, the capacitor 202 may be a 1-4 nano-farad capacitor, such as a 3 nano-farad capacitor, to provide a testing mode output 126' that is about a 1% shift from the sensing mode sensor output 126.

The controller 120 opens the switch 132 to connect the test circuit 130 to the sensor 104A or its sensor circuit and place the sensor 104A in the testing mode, and closes the switch 132 to disconnect the test circuit 130 from the sensor 104A or its sensor circuit and place the sensor 104A in the sensing mode. When in the testing mode (switch 132 opened), the capacitance output from the capacitive sensor 190B is shifted or offset from its value when the sensor 104A is operated in the sensing mode (switch 132 closed). The offset between these two values may be compared to the reference value 149 (FIG. 1) by the controller 120 to determine whether the sensor 104A is operating normally or abnormally.

Figure 6:
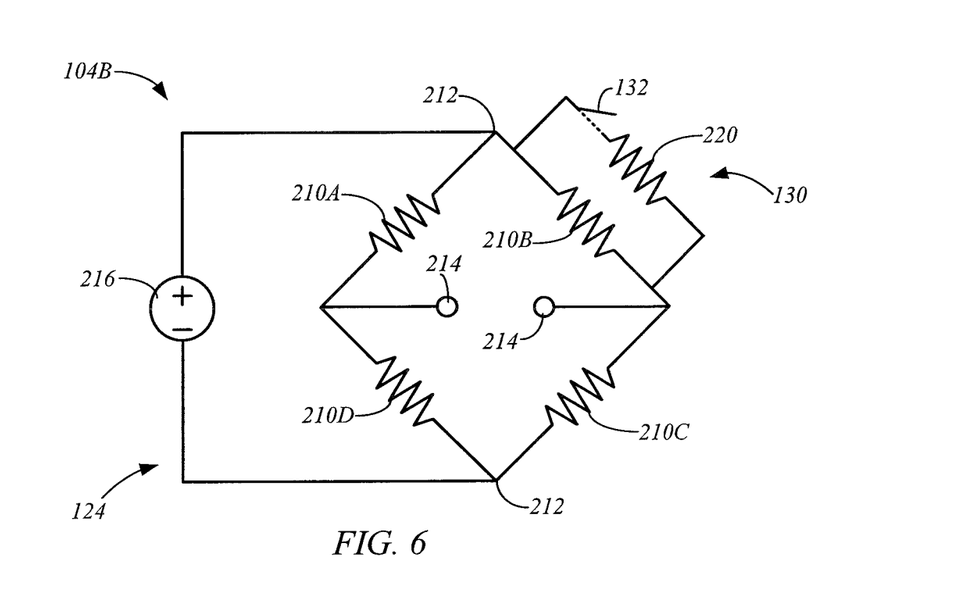
FIGS. 6 and 7 are simplified diagrams of exemplary strain gauge sensors in combination with exemplary test circuits, in accordance with embodiments of the present disclosure.
Figure 7:
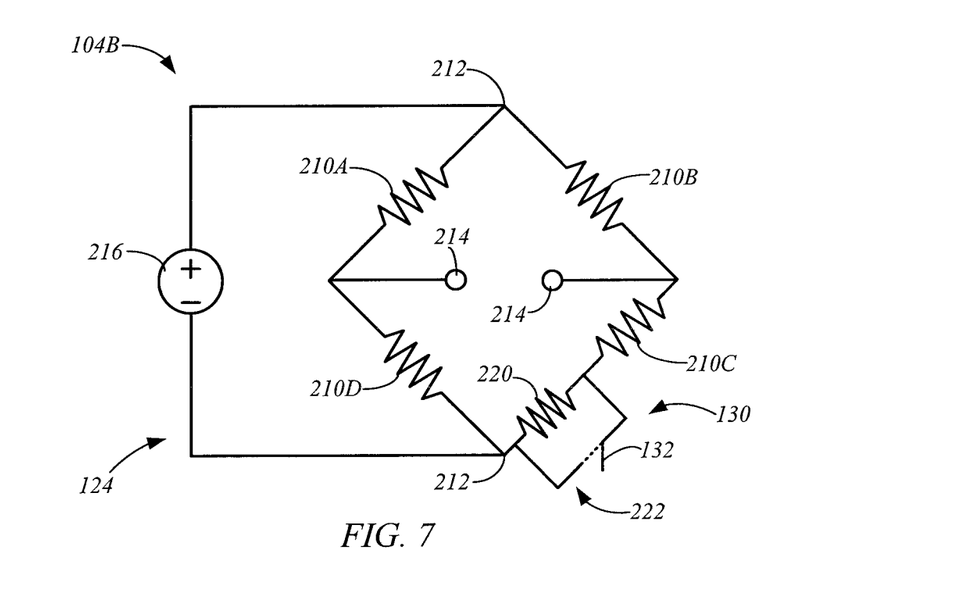

Strain gauge sensors have a resistance that changes in response to a strain on the sensor. Strain gauge sensors are known to be used as pressure sensors by detecting a strain on an element, such as a filter element that is exposed to a flow of the process medium 106, or a diaphragm that is exposed to a pressure at the process medium 106. FIGS. 6 and 7 are simplified diagrams of an exemplary strain gauge sensor 104B in combination with exemplary test circuits 130, in accordance with embodiments of the present disclosure. The sensor circuit 124 of the sensor 104B includes four strain gauges 210A-D in a Wheatstone bridge arrangement that includes a pair of input terminals 212 and a pair of output terminals 214. Each of the strain gauges 210 is connected in series between one of the input terminals 212 and one of the output terminals 214. The sensor circuit 124 also includes a current or voltage source 216 configured to drive a current into one of the input terminals 212. The sensor output 126 is based on the voltage between the output terminals 214 and varies in response to a strain applied to the strain gauges 210.

In some embodiments, the test circuit 130 includes a resistance 220, as shown in FIGS. 6 and 7. The resistance 220 of the test circuit 130 may be connected in series with the switch 132, and the resistance 220 and the switch 132 may be connected in parallel with one of the strain gauges 210, such as strain gauge 210B, as shown in FIG. 6. In this example, the resistance 220 and the switch 132 may be connected in series with one of the input terminals 212 and one of the output terminals 214. Any suitable resistance 220 may be used for the test circuit 130. For example, when the sensor 104B has a nominal bridge resistance of 10 kilo-ohms and a gauge factor of 20 milli-volts/volt, the resistance 220 may be approximately 8-12 mega-ohms, such as 10 mega-ohms, to provide a testing mode output 126' that is about a 1% shift from the sensing mode sensor output 126.

The controller 120 closes the switch 132 to connect the test circuit 130 to the sensor 104B or the sensor circuit 124 and place the sensor 104B in the testing mode, and opens the switch 132 to disconnect the test circuit 130 from the sensor 104B or the sensor circuit 124 and place the sensor 104B in the sensing mode. When in the testing mode (switch 132 closed), the sensor output (voltage across the output terminals) is shifted or offset from its value when the sensor 104B is operated in the sensing mode (switch 132 opened). As discussed above, the offset between these two values may be compared to the reference value 149 (FIG. 1) by the controller 120 to determine whether the sensor 104B is operating normally or abnormally.

The resistance 220 of the test circuit 130 shown in FIG. 7 is connected in parallel with the switch 132 to form a parallel circuit 222. The parallel circuit 222 is connected in series with one of the strain gauges 210, such as the strain gauge 210C, between one of the input terminals 212 and one of the output terminals 214, as shown in FIG. 7. Any suitable resistance 220 may be used for the resistance of the test circuit 130. For example, when the sensor 104B has a nominal bridge resistance of 10 kilo-ohms and a gauge factor of 20 milli-volts/volt, the resistance may be approximately 8-12 ohms, such as 10 ohms, to provide a testing mode output 126' that is about a 1% shift from the sensing mode sensor output 126.

The controller 120 opens the switch 132 to connect the test circuit 130 to the sensor 104B or the sensor circuit 124 and place the sensor 104B in the testing mode, and closes the switch 132 to disconnect the test circuit 130 from the sensor 104B or the sensor circuit 124 and place the sensor 104B in the sensing mode. When in the testing mode (switch 132 opened), the sensor output (voltage across the output terminals) is shifted or offset from its value when the sensor 104B is operated in the sensing mode (switch 132 closed). The offset of these two values may be compared to the reference value 149 (FIG. 1) by the controller 120 to determine whether the sensor 104B is operating normally or abnormally.

Temperature sensors, such as resistance temperature detectors (e.g., platinum resistance thermometers), have a resistance that changes in response to the temperature of the sensor. A temperature is detected using such sensors by detecting the resistance of the sensor using conventional techniques, such as by detecting a current through the sensor in response to an applied voltage, or detecting a voltage across the sensor in response to an applied current.

Figure 8:
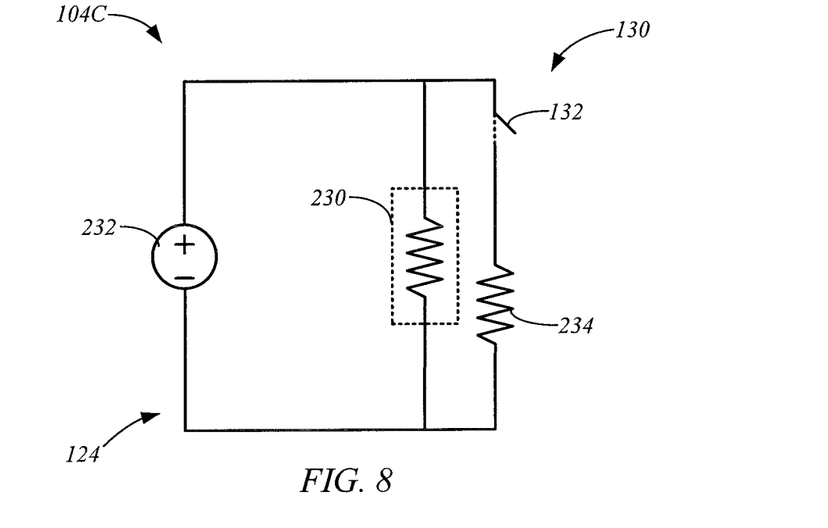
FIGS. 8 and 9 are simplified diagrams of exemplary temperature sensors in combination with exemplary test circuits, in accordance with embodiments of the present disclosure.
Figure 9:
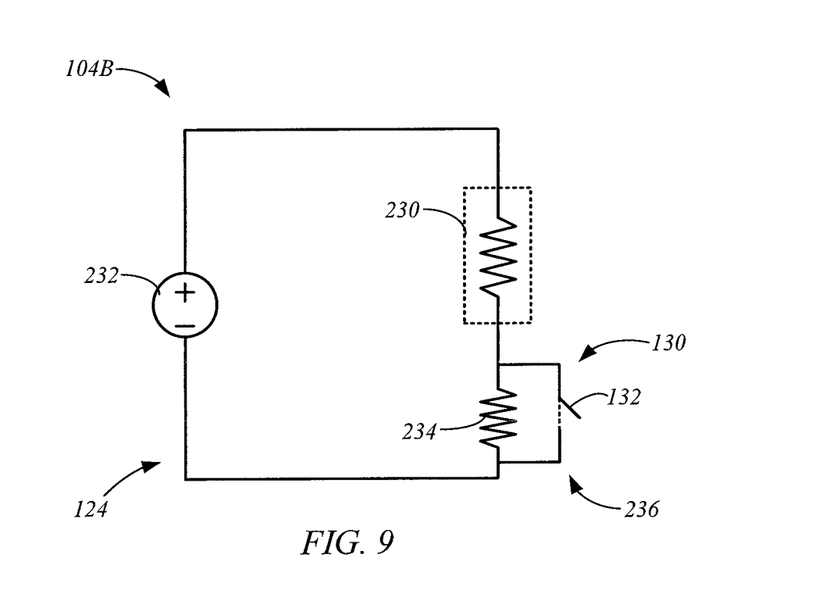

FIGS. 8 and 9 are simplified diagrams of an exemplary temperature sensor 104C in combination with exemplary test circuits 130, in accordance with embodiments of the present disclosure. The sensor circuit 124 of the temperature sensor 104C includes a resistance 230 that is dependent on its temperature. Additionally, the sensor circuit 124 may include conventional circuitry for detecting the value of the resistance 230, such as a voltage source 232 that applies a voltage across the resistance, and circuitry for detecting the current through the resistance 230, for example. The sensor output 126 may indicate the current through the resistance 230 in response to the applied voltage, from which the value of the resistance 230 and the detected temperature can be determined, for example.

In some embodiments, the test circuit 130 includes a resistance 234, as shown in FIGS. 8 and 9. The resistance 234 of the test circuit 130 may be connected in series with the switch 132, and the resistance 234 and the switch 132 may be connected in parallel with the resistance 230, as shown in FIG. 8.

Any suitable resistance 234 may be used for the test circuit 130. For example, when the resistance 230 is a 100 ohm platinum resistance thermometer and a nominal shift of 5° F. is desired, the value of the resistance 234 may be 10 kiloohms, for example.

The controller 120 closes the switch 132 to connect the test circuit 130 to the sensor 104C or the sensor circuit 124 and place the sensor 104C in the testing mode, and opens the switch 132 to disconnect the test circuit 130 from the sensor 104C or the sensor circuit 124 and place the sensor 104C in the sensing mode. When in the testing mode (switch 132 closed), the sensor output 126 (e.g., current across the resistance 230) is shifted or offset from its value when the sensor 104C is operated in the sensing mode (switch 132 opened). As discussed above, the offset between these two values may be compared to the reference value 149 (FIG. 1) by the controller 120 to determine whether the sensor 104B is operating normally or abnormally.

The resistance 234 of the test circuit 130 shown in FIG. 9 is connected in parallel with the switch 132 to form a parallel circuit 236. The parallel circuit 236 is connected in series with the resistance 230, as shown in FIG. 9. Any suitable resistance 234 may be used for the resistance of the test circuit 130. For example, when the resistance 230 is a 100 ohm platinum resistance thermometer and a nominal shift of 5° F. is desired, the value of the resistance 234 may be 1 ohm, for example.

The controller 120 opens the switch 132 to connect the test circuit 130 to the sensor 104C or the sensor circuit 124 and place the sensor 104C in the testing mode, and closes the switch 132 to disconnect the test circuit 130 from the sensor 104C or the sensor circuit 124 and place the sensor 104C in the sensing mode. When in the testing mode (switch 132 opened), the sensor output (e.g., current across the resistance 230) is shifted or offset from its value when the sensor 104C is operated in the sensing mode (switch 132 closed). The offset of these two values may be compared to the reference value 149 (FIG. 1) by the controller 120 to determine whether the sensor 104C is operating normally or abnormally.

Although the embodiments of the present disclosure have been described with reference to preferred embodiments, workers skilled in the art will recognize that changes may be made in form and detail without departing from the spirit and scope of the present disclosure.

What is claimed is:

1. A process transmitter comprising:
   a process variable sensor having an electrical characteristic that changes in response to a sensed process variable and thereby provides a sensor output that is indicative of the sensed process variable;
   a test circuit comprising an electrical component having an electrical characteristic of a same type as the electrical characteristic of the process variable sensor and used to determine a condition of the process variable sensor;
   a switch configured to selectively connect the test circuit to the process variable sensor and disconnect the test circuit from the process variable sensor; and
   a controller configured to:
      obtain a measurement of the process variable;
      control the switch;
      detect a condition of the process variable sensor by comparing the sensor output when the test circuit is connected to the process variable sensor to the sensor output when the test circuit is disconnected from the process variable sensor; and
      communicate the condition and the measurement to an external control unit.

2. The process transmitter of claim 1, wherein the controller is configured to:
   calculate a difference between the sensor output when the test circuit is connected to the process variable sensor and the sensor output when the test circuit is disconnected from the process variable sensor; and
   determine the condition of the process variable sensor based on a comparison of the difference to a reference value.

3. The process transmitter of claim 2, wherein:
   the process transmitter includes a temperature sensor having a temperature output that is indicative of a sensed temperature; and
   the condition of the process variable sensor is based on the temperature output.

4. The process transmitter of claim 2, wherein the process variable sensor comprises a differential pressure sensor comprising:
   a diaphragm supported between first and second sensor body cells and connected to a first output lead;
   a first capacitor electrode supported in the first sensor body cell and connected to a second output lead; and
   a second capacitor electrode supported in the second sensor body cell and connected to a third output lead;
   wherein the sensor output is based on a difference between a first capacitance measured between the first and second output leads and a second capacitance measured between the first and third output leads.

5. The process transmitter of claim 4, wherein the test circuit comprises a capacitor.

6. The process transmitter of claim 5, wherein:
   the capacitor and the switch are connected in series between the first and second output leads; and
   the controller closes the switch to connect the test circuit to the process variable sensor, and opens the switch to disconnect the test circuit from the process variable sensor.

7. The process transmitter of claim 4, wherein:
   the capacitor and the switch are connected in parallel to form a parallel circuit, and the parallel circuit is connected in series with the third output lead; and
   the controller opens the switch to connect the test circuit to the process variable sensor, and closes the switch to disconnect the test circuit from the process variable sensor.

8. The process transmitter of claim 2, wherein the process variable sensor comprises a strain gauge sensor comprising:
   four strain gauges in a Wheatstone bridge arrangement having a pair of input terminals and a pair of output terminals, each of the strain gauges is connected in series between one of the input terminals and one of the output terminals; and a current source configured to drive a current into one of the input terminals;

wherein the sensor output is based on a voltage between the output terminals.

9. The process transmitter of claim 8, wherein the test circuit comprises a resistor.

10. The process transmitter of claim 9, wherein:
the resistor and the switch are connected in parallel with one of the strain gauges; and
the controller closes the switch to connect the test circuit to the process variable sensor, and opens the switch to disconnect the test circuit from the process variable sensor.

11. The process transmitter of claim 9, wherein:
the resistor and the switch are connected in parallel to form a parallel circuit, and the parallel circuit is connected in series with one of the strain gauges; and
the controller opens the switch to connect the test circuit to the process variable sensor, and closes the switch to disconnect the test circuit from the process variable sensor.

12. The process transmitter of claim 2, wherein the process variable sensor comprises a temperature sensor, and the test circuit comprises a resistor.

13. The process transmitter of claim 2, wherein:
the process transmitter has a safety deviation; and
the sensor output when the test circuit is connected to the process variable sensor is less than one-half of the safety deviation from the sensor output when the test circuit is disconnected from the process variable sensor.

14. The process transmitter of claim 1 wherein the controller is further configured to obtain a measurement of the process variable while the test circuit is connected to the process variable sensor and communicate the measurement of the process variable to the external control unit.

15. A method of testing a process variable sensor of a process transmitter using a controller of the process transmitter, the process variable sensor having an electrical characteristic that changes in response to a sensed process variable and thereby provides a sensor output that is indicative of the sensed process variable, the method comprising:
setting a switch to disconnect a test circuit from the process variable sensor wherein the test circuit comprises an electrical component having an electrical characteristic of a same type as the electrical characteristic of the process variable sensor and used to determine a condition of the process variable sensor;
obtaining a first sensor output from the process variable sensor that is indicative of a sensed process variable;
setting the switch to connect the test circuit to the process variable sensor;
obtaining a second sensor output from the process variable sensor;
detecting a condition of the process variable sensor including comparing the first and second sensor outputs; and
communicating the condition to an external control unit.

16. The method of claim 15, wherein detecting a condition of the process variable sensor comprises:
calculating a difference between the first and second sensor outputs; and
comparing the difference to a reference value.

17. The method of claim 16, wherein:
the process variable sensor comprises a differential pressure sensor comprising:
a diaphragm supported between first and second sensor body cells and connected to a first output lead;
a first capacitor electrode supported in the first sensor body cell and connected to a second output lead; and
a second capacitor electrode supported in the second sensor body cell and connected to a third output lead;
wherein the sensor output is based on a difference between a first capacitance measured between the first and second output leads and a second capacitance measured between the first and third output leads;
the test circuit comprises a capacitor;
the capacitor and the switch are connected in series between the first and second output leads;
setting the switch to disconnect the test circuit from the process variable sensor comprises opening the switch; and
setting the switch to connect the test circuit to the process variable sensor comprises closing the switch.

18. The method of claim 16, wherein:
the process variable sensor comprises a differential pressure sensor comprising:
a diaphragm supported between first and second sensor body cells and connected to a first output lead;
a first capacitor electrode supported in the first sensor body cell and connected to a second output lead; and
a second capacitor electrode supported in the second sensor body cell and connected to a third output lead;
wherein the sensor output is based on a difference between a first capacitance measured between the first and second output leads and a second capacitance measured between the first and third output leads;
the test circuit comprises a capacitor;
the capacitor and the switch are connected in parallel to form a parallel circuit, and the parallel circuit is connected in series with the third output lead;
setting the switch to disconnect the test circuit from the process variable sensor comprises closing the switch; and
setting the switch to connect the test circuit to the process variable sensor comprises opening the switch.

19. The method of claim 16, wherein:
the process variable sensor comprises a strain gauge sensor comprising:
four strain gauges in a Wheatstone bridge arrangement having a pair of input terminals and a pair of output terminals, each of the strain gauges is connected in series between one of the input terminals and one of the output terminals; and
a current source configured to drive a current into one of the input terminals;
wherein the sensor output is based on a voltage between the output terminals;
the test circuit comprises a resistor;
the resistor and the switch are connected in parallel with one of the strain gauges; and
setting the switch to disconnect the test circuit from the process variable sensor comprises opening the switch; and
setting the switch to connect the test circuit to the process variable sensor comprises closing the switch.

20. The method of claim 16, wherein:

the process variable sensor comprises a strain gauge sensor comprising:

four strain gauges in a Wheatstone bridge arrangement having a pair of input terminals and a pair of output terminals, each of the strain gauges is connected in series between one of the input terminals and one of the output terminals; and a current source configured to drive a current into one of the input terminals;

wherein the sensor output is based on a voltage between the output terminals;

the test circuit comprises a resistor;

the resistor and the switch are connected in parallel to form a parallel circuit, and the parallel circuit is connected in series with the one of the strain gauges; and setting the switch to disconnect the test circuit from the process variable sensor comprises closing the switch; and setting the switch to connect the test circuit to the process variable sensor comprises opening the switch.

21. The method of claim 16, wherein:

the process transmitter includes a temperature sensor having a temperature output that is indicative of a sensed temperature; and detecting the condition of the process variable sensor is based on the temperature output.

22. The method of claim 16, wherein:

the process variable sensor comprises a temperature sensor; and the test circuit comprises a resistor.

23. The method of claim 15, wherein detecting the condition of the process variable sensor comprises:

setting the switch to disconnect the test circuit from the process variable sensor;

obtaining a third sensor output from the process variable sensor that is indicative of the process variable; and detecting the condition of the process variable sensor based on the first, second and third sensor outputs.

24. The method of claim 15 including determining a value of the sensed process variable based upon the second sensor output while the test circuit is connected to the process variable sensor and communicating the determined value of the sensed process variable to the external control unit.

* * * * *